United States Patent [19]
Ohhashi et al.

[11] Patent Number: 6,045,665
[45] Date of Patent: Apr. 4, 2000

[54] METHOD OF MANUFACTURING MEMBER FOR THIN-FILM FORMATION APPARATUS AND THE MEMBER FOR THE APPARATUS

[75] Inventors: Tateo Ohhashi, Kita-Ibaraki; Atsushi Fukushima; Hideyuki Takahashi, both of Kitaibaraki, all of Japan

[73] Assignee: Japan Energy Corporation, Japan

[21] Appl. No.: 09/085,133

[22] Filed: May 26, 1998

[30] Foreign Application Priority Data

Jun. 2, 1997 [JP] Japan ................... 9-157351

[51] Int. Cl.⁷ ........................... C23C 14/00
[52] U.S. Cl. ........................... 204/192.12
[58] Field of Search .............. 204/192.12, 298.12, 204/298.13; 216/2, 88, 37, 83

[56] References Cited

U.S. PATENT DOCUMENTS 5,891,353 4/1999 Masumura et al. .............. 216/88

FOREIGN PATENT DOCUMENTS

| | | |
|---|---|---|
| 61-056277 | 3/1986 | Japan . |
| 62-142758 | 6/1987 | Japan . |
| 63-162861 | 7/1988 | Japan . |
| 1-316456 | 12/1989 | Japan ................... 12/6 |
| 2-285067 | 11/1990 | Japan . |
| 3-087357 | 4/1991 | Japan . |
| 3-138354 | 6/1991 | Japan . |
| 8-176816 | 7/1996 | Japan . |
| 2228745 | 9/1990 | United Kingdom . |

OTHER PUBLICATIONS

English Abstract of the Japanese publication No. 08–176816.
English Abstract of the Japanese publication No. 61–056277.
English Abstract of the Japanese publication No. 63–162861.
English Abstract of the Japanese publication No. 02–285067.
English Abstract of the Japanese publication No. 03–138354.
English Abstract of the Japanese publication No. 01–316456.
English Abstract of the Japanese publication No. 03–087357.
English Abstract of the Japanese publication No. 62–142758.
Database WPIL on Questel, week 9244, London: Derwent Publications Ltd., AN 92–360194; & JP 04–259937 A (Victor Co. of Japan), abstract.

*Primary Examiner*—William Krynski
*Assistant Examiner*—Hong J. Xu

[57] ABSTRACT

A technique to prevent peeling of deposits formed on the surface of the inner walls of the thin-film formation apparatus and the members inside the apparatus and to suppress particle production without contamination of the inside of the apparatus. A member for a thin-film formation apparatus having inner walls and a method for manufacturing the member is provided. A plurality of unevenness is provided on at least a portion of the surface of the member and the inner walls on which unnecessary thin films are deposited. The surfaces are subjected to masking, and then, etching processing to form the plurality of unevenness. After the etching processing the masking is removed.

14 Claims, 2 Drawing Sheets

METHOD OF MANUFACTURING MEMBER FOR THIN-FILM FORMATION APPARATUS AND THE MEMBER FOR THE APPARATUS

FIELD OF THE INVENTION

The present invention relates to a member and a method of manufacturing a member for a thin-film formation apparatus, and more particularly, the present invention relates to a member and thin-film formation apparatus which, in use, reduces particle production during sputtering processing.

DESCRIPTION OF THE PRIOR ART

In recent years, thin-film formation techniques using vapor-phase growth has been extensively employed for electrodes of integrated circuits, thin films for diffusion barrier, magnetic thin films for magnetic recording media, Indium Tin Oxide (ITO) transparent conductive films of liquids crystals displays, etc. A sputtering method, one of the vapor-phase growth methods, has been widely employed, since it can be applied to a wide range of materials and its film formation control is relatively easy.

This well known sputtering method forms thin films by making charged particles impinge against a sputtering target, expelling the particles of a substance constituting the sputtering target therefrom with the impinging force, and depositing these particles on a substrate such as a wafer placed facing the target.

However, upon formation of thin films by vapor phase growth such as sputtering described above, a problem of particle production has attracted great attention.

These particles will be explained by exemplifying those derived from a target in the sputtering method. When a target is subjected to sputtering, thin films are deposited everywhere, such as, the inner walls of the thin-film formation apparatus, the members inside the apparatus, and on a substrate. Flakes peeling from the members inside the thin-film formation apparatus scatter and are directly deposited on the substrate surface. This is considered to be one of the causes of particle production.

In addition, on the target surface, foreign substances called nodules, which are considered to be produced from flakes peeling from the side surface of the target and the members inside the thin-film formation apparatus, serve as cores and grow to a size of several micrometers in diameter. When these nodules have grown to a certain level, they are broken, scatter, and are deposited on the surface of the substrate. This is also one of the causes of particle production.

When those particles mentioned above are deposited on fine wirings on the substrate, problems such as short-circuiting and, on the contrary, breaking of the wires are caused, for example, in the case of Large Scale Integration (LSI).

In recent years, since LSI semiconductor devices have been highly integrated (16 M bits, 63 M bits, and further 254 M bits, etc.) and have become finer, for example, wiring width (rule) has been reduced to 0.25 $\mu$m or less, the above-mentioned problems such as breaking of wires and short-circuiting have occurred more frequently. Thus, the problem of particle production has become significant as electronic device circuits have become more highly integrated and fine.

As mentioned above, as one of the causes of particle production, a problem of deposition of thin films on the regions, where film formation is essentially not required, of the inner walls of the film formation apparatus or the members inside the apparatus has attracted great attention. Specifically, deposition on peripheral parts of a substrate, shields, backing plates, shutters, targets, and supporting devices thereof can be mentioned.

Since thin films peel from the site, where unnecessary thin films are deposited, and scatter to cause particle production as mentioned above, a technique in which the inner walls of the film formation apparatus, peripheral parts of a substrate, shields, backing plates, shutters, targets and supporting devices thereof are periodically cleaned or exchanged before these deposits become thick and peel has been adopted.

In addition, in order to prevent thin films once deposited from peeling and scattering, at sites of a member (equipment) on which a great amount of thin films are deposited, sprayed metal coatings have been formed (See Japanese Patent Laid-Open Nos. 61-56227 and 8-176816) or deposits have been captured by physical surface roughing treatment such as blast treatment. (See Japanese Patent Laid-Open No. 62-142758).

In addition, since the above-mentioned operations were considered to reduce operation efficiency of thin-film formation, a removable anti-deposition plate to capture deposits was designed in order to prevent deposits from peeling and scattering, and further improvements of the plate were made by changing a thermal expansion coefficient of the plate and by subjecting the plate surface to sand-blast treatment and hair-line treatment. (See Japanese Patent Laid-Open Nos. 63-162861, 2-285067, and 3-138354).

Among these, so-called PARTICLE GETTER (Trade Name) with special surface treatment was epoch-making in efficiently preventing particle production under the technological level of that time. (See Japanese Patent Laid-Open Nos. 1-316456 and 3-87357).

Recently, however, aspect ratios of contact holes and via holes have increased to 3 or more due to a tendency toward fining of wiring rules as mentioned above and it has thus become difficult to fill these holes by conventional sputtering methods. Therefore, highly directional sputtering methods such as collimation sputtering and long-throw have appeared, which require making power twice as large as that required conventionally.

As a result, the density and dispersion of plasma formed during sputtering have been increased so that the surface of shields, collimators, targets, etc., in the vicinity of plasma are simultaneously subjected to sputtering in addition to deposition of thin films.

When the sprayed metal coatings or blast treatment is carried out directly on the inner walls of apparatus or equipment, or anti-deposition plate, as measures to capture the above deposits to prevent their peeling and scattering, the following problems occur: sprayed metal coatings themselves, and residual blast material in the case of blast treatment, are sputtered especially in the early stage of sputtering to contaminate the whole inside of the sputtering apparatus.

Even when the anti-deposition plate was used alone, it had a thickness of its own to limit place for installation. In addition, when sputtering making power was remarkably increased, problems similar to those for sprayed metal coatings and blast-processed material occurred.

As described above, the problem of particle production has not been solved and the measures which have been adopted to prevent particle production, such as sprayed metal coatings and blast treatment, and anti-deposition plates having undergone these processings have themselves caused the serious problem of contaminating thin films.

OBJECTS OF THE INVENTION

Therefore, an object of the present invention is to provide a method of manufacturing a member of a thin-film formation apparatus which efficiently prevents peeling of deposits formed on the surface of the inner walls of the thin-film formation apparatus and members inside the apparatus and suppresses particle production without contaminating the inside of the thin-film formation apparatus.

A further object of the present invention is to provide a member for a thin-film formation apparatus which prevents peeling of deposits from the surface of the member.

SUMMARY OF THE INVENTION

According to one aspect of the present invention, a method is provided for manufacturing a member for a thin-film formation apparatus having inner walls. The member and inner walls each have surfaces on which unnecessary thin films are deposited during sputtering. The method includes subjecting at least a portion of the surfaces to masking, and after masking, subjecting the portion of the surfaces to etching processing. The masking is removed after the etching processing so that the surface is provided with an unevenness.

According to another aspect of the present invention, a member is provided for a thin-film formation apparatus. The member comprises a surface having a plurality of concave and convex parts formed on at least a portion of the surface by etching processing. The portion of the surface subjected to etching processing has a center line surface roughness (Ra) of about 5 to about less than 100 $\mu$m.

Preferably, one of the plurality of concave parts and the plurality of convex parts is arranged regularly at constant intervals. Also, preferably one of the plurality of concave parts and one of the plurality of convex parts is formed about 1 to about 100,000 per unit area(1 mm$^2$)on the portion of the surface which has been subjected to etching processing. In addition, each of the concave parts is preferably a recess formed in the surface, the recesses having an average diameter; and each of the convex parts is preferably located adjacent to at least one concave part. The average diameter of the recesses is about 3 to about 1000 $\mu$m.

Finally, preferably the surfaces of the inner walls and the member are composed of a metal or an alloy, and have a sum of detection areas of contaminant elements other than gas elements such as oxygen, nitrogen, and carbon. The sum of detection areas of contaminant elements of the member as measured by Elactron Probe Microanalyer (EPMA) analysis is preferably less than about 0.1%.

DETAILED DESCRIPTION OF THE PREFERRED EMBODIMENTS

Figure 1A:
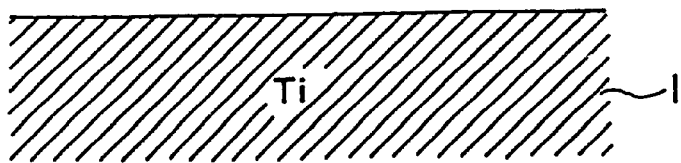
FIGS. 1A, 1B, 1C and 1D are schematic illustrations showing an example of etching processing.

In order to achieve the above and other objects, the inventors of the present invention devoted themselves in research and obtained the following results.

Although relatively soft metals such as nickel and aluminum which readily adhere to objects to be sprayed and can absorb stress of deposits by sputtering have been employed for conventional sprayed metal coatings, it was found that all metal materials used for spray coating had low level of purity, about 2N, and thus directly caused contamination when sprayed onto a member for a thin-film formation apparatus, etc.

It was also found that, blast materials generally employed in blast treatment, such as alumina and silicone carbide, bit into the material to be subjected to blast treatment and remained on the surface, since they were massive or had a needle-like shape. Such foreign matters are thus sputtered in the early phase of thin-film formation and extensively contaminate the inside of the thin-film formation apparatus and in the worst case further contaminate sputtering thin-films on the substrate.

In order to solve the above-mentioned problems and to realize surface roughing without contamination, etching processing, a chemical method, has been attempted instead of conventional surface-roughing processing by physical methods. As a result, it was found that sufficient adhesive strength of deposits could be attained by making the surface rough while maintaining the cleanness of the surface by means of etching.

It was also found that adequate surface roughness was achieved by first masking a part of the surface before etching processing the whole surface in order to control the sites to be etched and the depths of the etched sites. The cleanness of the surface is maintained by removing the masking material by washing it after etching. It was also found that the adhesive strength of deposits on the etched surface which was masked as described above are stronger than that achieved on surfaces which have merely been etching over the whole surface without any masking.

An idea that the inner walls of the thin-film formation apparatus and equipment (member) positioned inside the apparatus are subjected to etching processing so as to form unevenness in order to prevent thin films deposited on the members, etc. from peeling and scattering and thereby to prevent particle production has not yet been present and was found to be novel and quite effective.

Unevenness formed on the inner walls of the thin-film formation apparatus and equipment (members) placed inside the apparatus by etching can remarkably increase surface area, decrease deposits per unit area, and remarkably reduce splitting and peeling of deposits by suppressing an elevation in internal stress accompanying an increase in deposits.

The center line surface roughness (Ra) of the surface having undergone etching processing of the uneven parts formed by etching processing was set to be 5 to less than 100 $\mu$m, in order to increase surface area remarkably and to provide concave or convex parts with sufficient adhesive strength to deposits by an anchor effect.

When the center line surface roughness is less than 5 $\mu$m, the adhesive strength is insufficient. On the other hand, when the center line surface roughness is 100 $\mu$m or more, thin films are deposited only on the side surface of the concave or convex parts facing the plasma side, and the amount of deposits decrease or become zero on the opposite side. In such cases, deposits became uneven as a whole and an anchor effect was not effected. Thus the concave and convex parts readily caused peeling.

From above, in order to provide the concave or convex parts with sufficient adhesive strength and an anchoring effect, it is desirable that the intervals of the concave or convex parts formed by etching processing are constant and that they are arranged regularly. It can increase the possibility to obtain homogeneous deposition of thin films and allow the adhesive strength due to an anchor effect to be exerted more effectively.

It was found that the adhesibility was improved as compared with a conventional roughing processing by blast, since the surface subjected to surface roughing by said masking and etching is clean and no contamination layer is present in the interface between the deposit and the processed surface, as a result of a secondary effect.

Masking materials may be those, which, of course, have an anti-etching property and are easily removed by washing after etching processing, and are not particularly limited. For example, photosetting resists generally used for formation of electronic circuits can be employed.

Figure 1B:
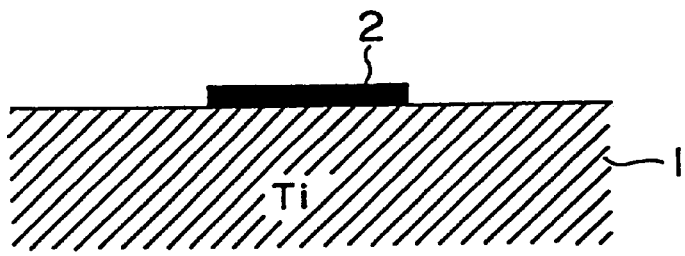
Figure 1C:
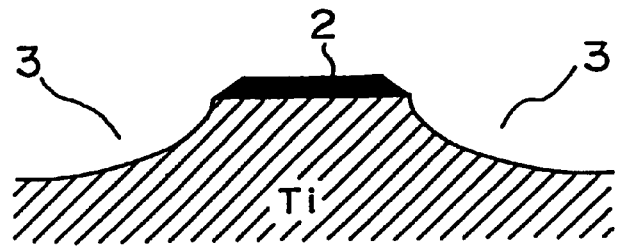
Figure 1D:
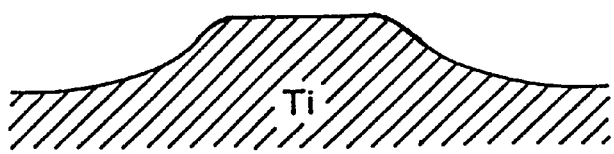

An example is shown in the schematic illustrations of FIGS. 1A, 1B, 1C and 1D. FIG. 1A represents a sectional view of processed material before processing; FIG. 1B represents a sectional view of a processed material to which resist has been applied; FIG. 1C represents a sectional view of the processed material, a part of which has been removed by etching processing; and FIG. 1D represents a sectional view of the processed material from which resist has been removed after etching processing. FIGS. 1A to 1D are arranged in the order of steps of the method.

As shown in FIGS. 1A to 1D, for example, on a titanium (Ti) processed material 1, photosetting resist 2 is applied evenly on the surface to be roughed, and a part of the resist to be set is exposed to light to set. Then, the resist 2 on the part which has been set is removed by washing.

Then, according to the materials of foundations, that is, processed material 1 and resist material 2, an etching material such as an acidic aqueous solution, alkaline aqueous solution, or reactive gas is selected. The processed material 1 on which the resist 2 has been applied is placed in the etching atmosphere selected to proceed etching processing on parts 3 other than the parts where the resist 2 remained to form unevenness on the surface.

Surface roughness is controlled by the size of each part to be masked, the number of concave or convex parts per unit area, the composition of etching processing materials used, and the reaction time.

Figure 2A:
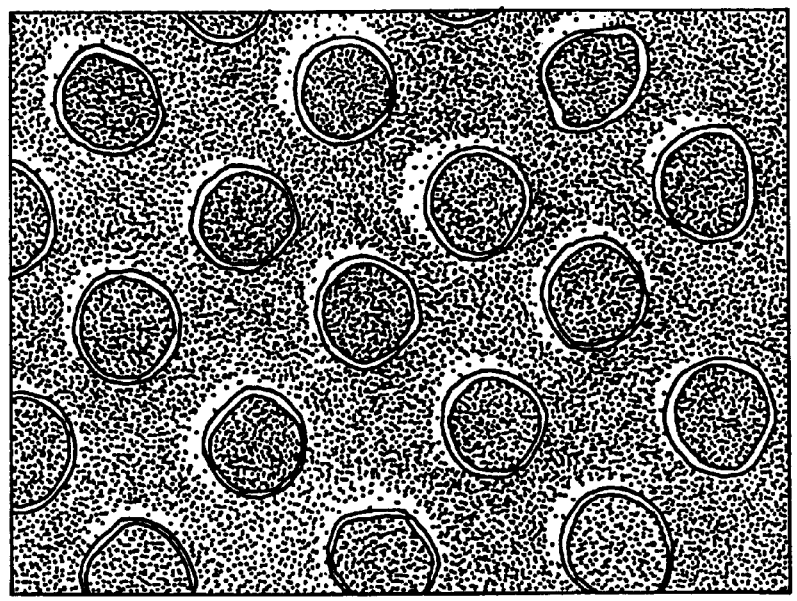
FIGS. 2A and 2B show schematic plan and sectional views, respectively, of formation of unevenness on the processed material.
Figure 2B:
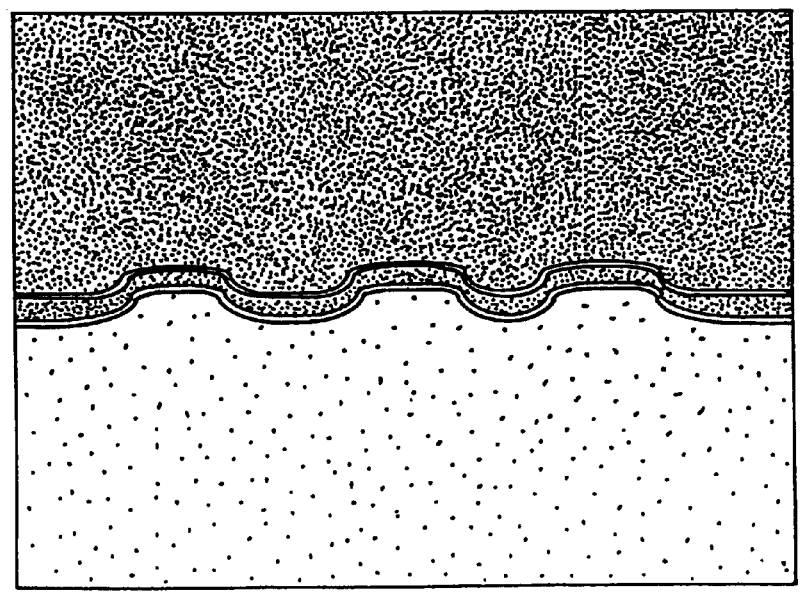

FIGS. 2A and 2B show schematic illustrations (copies of a photo) of a plan view and a sectional view, respectively, of a processed material on which unevenness was formed by etching processing. As shown in FIGS. 2A and 2B, concave or convex parts formed by etching processing are arranged regularly at constant intervals.

Metals or alloys with high purity are used as material constituting the member of the part, where unnecessary thin films are deposited on the inner walls of the thin-film formation apparatus or the member inside the apparatus. Therefore, it is necessary that contaminants, such as alumina and silicon carbide lis remaining due to a low purity sprayed coating, and blast treatment material that have been preformed conventionally, are not present.

From above, the sum of detection areas of contaminant elements other than light elements (refer to as gas components as a whole) such as oxygen, nitrogen, and carbon obtained by EPMA (electron probe microanalyzer) analysis must be less than 0.1% per unit area of the metal or alloy material. When the amount of contaminants is reduced to such a level, deposition of contaminants on the substrate during film formation is remarkably reduced.

Although the center line surface roughness (Ra) of the unevenness largely affects the prevention of particle production, it is also important to control the number of unevenness per unit area and the size (diameter) of each unevenness in order to achieve a sufficient anchor effect in capturing substances scattering to the inner walls or members of the thin-film formation apparatus.

As for the number of unevenness, when the number of concave or convex parts to fix deposits is less than $1/mm^2$, a sufficient anchor effect cannot be attained. On the other hand, when the number exceeds $100,000/mm^2$, the anchoring effect is reduced because the intervals among the unevenness are shrunk, and shadow parts appear in the bottoms of the concave parts or among the convex parts on the surface which has been roughed to a surface roughness (Ra) of 5 $\mu$m or more as mentioned above and parts on which scattered substances are not deposited. Therefore, it is necessary that 1 to 100,000 concave or convex parts per unit area (1 $mm^2$) are formed on the surface processed with etching and it is desirable to adjust the number in this range.

In addition, in order to exert a sufficient anchor effect, the average diameter of the holes, or recesses, of the concave parts or the average diameter of the top surfaces of the convex parts is inevitably limited. "Diameter" used herein is an average diameter of the full length of the hole of concave parts or the top surfaces of the convex parts formed by etching. In a more strict manner, it means, for the concave parts, an average diameter of the parts with the maximum diameter of the entrance of the holes, and for the convex parts, an average diameter of the generally almost flat top surfaces remaining after etching processing.

For the shapes of the holes of the concave parts or the top surface of the convex parts observed from the above, that is, planar shapes, various shapes such as round, oval, rectangular may be selected. Although shapes slightly different from the intended shapes may be obtained by etching processing, these variations are included, provided that their average diameters are within the range mentioned above.

When the uneven part as mentioned above is considered to be oval, planar shapes in which the long-axis diameter is significantly different from the short-axis must be avoided, if possible, since parts without deposition or uneven deposits tend to occur in parts with a narrow diameter, resulting in anisotrophy in anti-peeling strength. Therefore, shapes with an even diameter, such as round and square, are desirable for holes of concave parts and top surfaces of convex parts.

When the number of uneven parts per unit area is defined, the average diameter of the holes of the respective concave parts or the top surface of the respective convex parts must be 3 to 1,000 $\mu$m and it is desirable to adjust the diameter in this range.

As in the case of the number of uneven parts, when a size of each uneven part is less than 3 $\mu$m and the surface roughness (Ra) is 5 $\mu$m or more, parts without deposition appear in the bottoms of the concave parts of the roughed surface, and the protruded parts which fix the deposition membrane has insufficient strength and thus a sufficient anchor effect is not exerted on the convex parts.

Although formation of unevenness by etching processing has been described, a similar anchor effect to capture scattering substances is obtained, when only concave parts or only convex parts are formed on the surface of the members, etc., by masking and etching. Therefore, concave and convex can be optionally selected, as required.

EXAMPLES

Titanium shields (members) subjected to various surface-roughing treatments (to form uneven parts) shown in Table 1, Examples according to the present invention, were placed in a sputtering apparatus. In the Examples, the concave and convex parts were arranged regularly at constant intervals.

A titanium target for sputtering was employed to carry out reactive sputtering in a nitrogen gas atmosphere to form titanium nitride (TiN) thin films on a substrate. When about 10 μm of TiN was deposited on said titanium shield, sputtering was terminated. The titanium shield was removed from the sputtering apparatus and subjected to a peeling test using a scotch tape. In order to determine whether or not there was differences according to the types of unevenness formed by etching, the same number of specimens were prepared for different types of unevenness and subjected to the peeling test. The size of unevenness shown in Table 1 is an average diameter of the holes of the concave parts or that of the top surfaces of the convex parts as explained above.

At the same time, the presence of contamination of TiN thin film formed on the substrate and derived from said titanium shield caused by surface roughing was analyzed by SIMS (secondary ion mass spectrophotometry). For the titanium shield (member), the sum of detection areas of contaminant elements other than gas components such as oxygen, nitrogen, and carbon previously obtained by EPMA analysis was measured. EPMA-8705 manufactured by Shimadzu was used as the EPMA analyzer under the following measurement conditions: acceleration voltage: 15 KV; probe diameter: 1 μm; and sample current: 0.04 μA.

The results are summarized in Table 1.

Table 2 were placed to form titanium nitride (TiN) thin film on a substrate by sputtering in similar conditions. When about 10 μm of TiN was deposited on the titanium shield, sputtering was terminated. The titanium shield was removed from the sputtering apparatus and subjected to the peeling test using scotch tape.

As in the aforementioned Examples, the presence of contamination of TiN thin film formed on the substrate derived from said titanium shield cause by surface roughing was analyzed by SIMS (secondary ion mass spectrophotometry). For the titanium shield (member), the sum of detection areas of contaminant elements other than gas components such as oxygen, nitrogen, and carbon previously obtained by EPMA analysis was measured. EPMA analysis was conducted under conditions similar to those in the aforementioned Examples.

The results are summarized in Table 2. In Table 2, for those on which no unevenness was formed by etching processing, that is, those which were subjected to grinding with a grinding stone or those with sprayed metal coating, the processing conducted is described in the parentheses, instead of the size of evenness (diameter in μm) and the

TABLE 1

| | Ra (μm) | EPMA Analysis (Detection area ratio) | Size of Unevenness (Diameter in μm) | No. Of Unevenness (No./mm$^2$) | Peeling Test | Results of SIMS Analysis |
|---|---|---|---|---|---|---|
| Example 1 | 5 | Less than 0.1% | 5 | 36000 | No peeling | Not detected |
| Example 2 | 7 | Less than 0.1% | 50 | 360 | No peeling | Not detected |
| Example 3 | 10 | Less than 0.1% | 150 | 36 | No peeling | Not detected |
| Example 4 | 10 | Less than 0.1% | 250 | 8 | No peeling | Not detected |
| Example 5 | 30 | Less than 0.1% | 800 | 1 | No peeling | Not detected |
| Example 6 | 30 | Less than 0.1% | 5 | 20000 | No peeling | Not detected |
| Example 7 | 50 | Less than 0.1% | 50 | 200 | No peeling | Not detected |
| Example 8 | 50 | Less than 0.1% | 150 | 22 | No peeling | Not detected |
| Example 9 | 90 | Less than 0.1% | 250 | 8 | No peeling | Not detected |
| Example 10 | 90 | Less than 0.1% | 800 | 1 | No peeling | Not detected |

Comparative Examples

As comparative examples, titanium shields (members) subjected to various surface roughing treatments shown in number of evenness (number/mm$^2$). The size of unevenness here represents, as for Table 1, an average diameter of the holes of the concave parts or the average diameter of the top surfaces of the convex parts as described above.

TABLE 2

| | Ra (μm) | EPMA Analysis (Detection area ratio) | Size of Unevenness (Diameter in μm) | No. Of Unevenness (No./mm$^2$) | Peeling Test | Results of SIMS Analysis |
|---|---|---|---|---|---|---|
| Comparative Example 1 | 4 | Less than 0.1% | 250 | 8 | Peeling | Not detected |
| Comparative Example 2 | 150 | Less than 0.1% | 250 | 8 | Peeling | Not detected |

TABLE 2-continued

|  | Ra (μm) | EPMA Analysis (Detection area ratio) | Size of Unevenness (Diameter in μm) | No. Of Unevenness (No./mm$^2$) | Peeling Test | Results of SIMS Analysis |
|---|---|---|---|---|---|---|
| Comparative Example 3 | 1 | 0.1 Si | (Grinding with Si grinding stone) | | Peeling | Si detected |
| Comparative Example 4 | 2 | 0.05 Si | (Grinding with Si grinding stone and soft etching) | | Peeling | Not detected |
| Comparative Example 5 | 5 | 2 Si | (SiC blast surface roughing) | | Peeling | Si detected |
| Comparative Example 6 | 20 | 100 Al | (Al spray coating) | | No Peeling | Al detected |
| Comparative Example 7 | 25 | Less than 0.1% | 800 | 0.5 | Peeling | Not detected |
| Comparative Example 8 | 25 | Less than 0.1% | 1100 | 0.7 | Peeling | Not detected |
| Comparative Example 9 | 5 | Less than 0.1% | 2.5 | 120000 | Peeling | Not detected |
| Comparative Example 10 | 5 | Less than 0.1% | 2 | 100000 | Peeling | Not detected |

Turning now to the Examples according to the present invention, they are explained by comparing with the above Comparative Examples.

As shown in Table 1, the sum of detection areas of contaminant elements other than gas components such as oxygen, nitrogen, and carbon obtained by EPMA analysis of the titanium shields (members) was less than 0.1% for all Examples 1–10. As a result of SIMS (secondary ionic mass spectrophotometry) analysis concerning the presence of contamination of TiN thin film formed on the substrate due to surface roughing derived from the titanium shield, no contaminant elements were detected.

On the other hand, as shown in Comparative Examples 3, 5, and 6, in the titanium shield subjected to grinding with an Si grinding stone, blast roughing with SiC, and spraying with an Al coating, respectively, their major materials, Si and Al, were detected by EPMA analysis. The above materials, Si and Al, were also detected in the substrates by SIMS analysis, indicating contamination with these materials after sputtering. In other words, it has become clear that a grinding stone, blast surface roughing, and spray metal coating cause contamination of substrates and are not preferable.

In Comparative Example 4, no contaminants were detected on the substrate, since soft-etching processing was conducted following grinding with an Si grinding stone.

As for the results of the peeling test, for Examples 1–10, in which the center line surface roughness (Ra) of the surface subjected to etching processing was in a range of not less than 5 μm to less than 100 μm, the size of the unevenness (diameter is μm) was 3 to 1,000, and the number of unevenness (number/mm$^2$) was 1 to 100,000, no peeling occurred in the peeling test.

On the other hand, all Comparative Examples 1–10 except for Comparative Example 6, peeling readily occurred in the peeling test. As described above, Comparative Example 6 cannot be employed although no peeling occurred, since sprayed Al coating served as a contaminant. Especially, in Comparative Examples 3 and 5, bad results were obtained due to the presence of contaminants in addition to easy peeling.

For the Examples according to the present invention, the same number of samples were tested by changing the type of unevenness formed by etching processing. There was no difference in peelability according to the type of unevenness in the range of conditions for unevenness according to the present invention.

In the Examples according to the present invention, as shown by comparison with the Comparative Examples, since no contaminants were observed on the inner walls and inner equipment of the thin-film formation apparatus attributable to blast materials or spray coating materials conventionally applied for surface roughing, and peeling of thin films and scattering thereby were reduced, it is found that the present invention exerts an excellent effect to remarkably reduce the incidence of particle production in products with thin films such as wiring material formed on substrates.

Although the present invention is described mainly for the sputtering method and apparatus, it is not restricted to these examples and can be applied to other thin-film formation methods such as Physical Vapor Deposition (PVD) and Chemical Vapor Deposition and apparatus. In addition, while the present invention is illustrated based on the above example, they are merely examples, and it will be obvious that various changes and modifications may be made without departing from the scope of the present invention. All these changes and modifications are included in the scope of the present invention.

The present invention has the excellent effect of preventing peeling of deposits formed on the surface of the inner walls of the thin-film formation apparatus and the members inside the apparatus and of suppressing particle production without contamination of the inside of the apparatus.

What is claimed is:

1. A member for a thin-film formation apparatus, said member comprising a surface and a plurality of concave and convex parts formed on at least a portion of said surface by etching processing, said portion of said surface which has been subjected to etching processing having a center line surface roughness (Ra) of about 5 to about less than 100 μm, one of said plurality of concave parts and said plurality of convex parts being arranged regularly at constant intervals.

2. A member for a thin-film formation apparatus, said member comprising a surface and a plurality of concave and convex parts formed on at least a portion of said surface by etching processing, said portion of said surface which has been subjected to etching processing having a center line surface roughness (Ra) of about 5 to about less than 100 μm, one of said concave and convex parts being formed about 1 to about 100,000 per unit area(1 mm$^2$) on said portion of said surface which has been subjected to etching processing.

3. A member for a thin-film formation apparatus according to claim 1, wherein one of said concave and convex parts is formed about 1 to about 100,000 per unit area(1 mm$^2$) on said portion of said surface which has been subjected to etching processing.

4. A member for a thin-film formation apparatus, said member comprising a surface and a plurality of concave and convex parts formed on at least a portion of said surface by etching processing, said portion of said surface which has been subjected to etching processing having a center line surface roughness (Ra) of about 5 to about less than 100 μm, each of said concave parts being a recess formed in said surface, said recesses having an average diameter; each of said convex parts being located adjacent to at least one concave part and having a top surface, said top surfaces having an average diameter; and one of said average diameter of said recesses and said average diameter of said top surfaces being about 3 to about 1000 μm.

5. A member for a thin-film formation apparatus according to claim 1, wherein each of said concave parts is a recess formed in said surface, said recesses having an average diameter; wherein each of said convex parts is located adjacent to at least one concave part and has a top surface, said top surfaces having an average diameter; and wherein one of said average diameter of said recesses and said average diameter of said top surfaces is about 3 to about 1000 μm.

6. A member for a thin-film formation apparatus according to claim 2, wherein each of said concave parts is a recess formed in said surface, said recesses having an average diameter; wherein each of said convex parts is located adjacent to at least one concave part and has a top surface, said top surfaces having an average diameter; and wherein one of said average diameter of said recesses and said average diameter of said top surfaces is about 3 to about 1000 μm.

7. A member for a thin-film formation apparatus according to claim 3, wherein each of said concave parts is a recess formed in said surface, said recesses having an average diameter; wherein each of said convex parts is located adjacent to at least one concave part and has a top surface, said top surfaces having an average diameter; and wherein one of said average diameter of said recesses and said average diameter of said top surfaces is about 3 to about 1000 μm.

8. A member for a thin-film formation apparatus according to claim 1, wherein said member is a sputtering target.

9. A member for a thin-film formation apparatus according to claim 2, wherein said member is a sputtering target.

10. A member for a thin-film formation apparatus according to claim 3, wherein said member is a sputtering target.

11. A member for a thin-film formation apparatus according to claim 4, wherein said member is a sputtering target.

12. A member for a thin-film formation apparatus according to claim 5, wherein said member is a sputtering target.

13. A member for a thin-film formation apparatus according to claim 6, wherein said member is a sputtering target.

14. A member for a thin-film formation apparatus according to claim 9, wherein said member is a sputtering target.

* * * * *